United States Patent [19]

Willard et al.

[11] Patent Number: 5,378,502
[45] Date of Patent: Jan. 3, 1995

[54] METHOD OF CHEMICALLY MODIFYING A SURFACE IN ACCORDANCE WITH A PATTERN

[75] Inventors: Nicolaas P. Willard; Ivo G. J. Camps, both of Eindhoven, Netherlands

[73] Assignee: U.S. Philips Corporation, New York, N.Y.

[21] Appl. No.: 114,542

[22] Filed: Aug. 31, 1993

[30] Foreign Application Priority Data

Sep. 9, 1992 [XH] Hague Agreement ............ 92202730

[51] Int. Cl.⁶ ............................................. B05D 3/10
[52] U.S. Cl. .................................. 427/305; 427/558; 427/443.1; 427/269
[58] Field of Search ............... 427/305, 163, 165, 333, 427/555, 269, 558, 387, 443.1

[56] References Cited

U.S. PATENT DOCUMENTS

| | | | |
|---|---|---|---|
| 4,008,084 | 2/1977 | Ikeda et al. | 427/255.7 |
| 4,125,672 | 11/1978 | Kakuchi et al. | 427/273 |
| 4,261,800 | 4/1981 | Beckenbaugh et al. | 427/558 |
| 4,396,703 | 8/1983 | Matsumoto et al. | 427/140 |
| 4,440,801 | 4/1984 | Aviram et al. | 427/558 |
| 4,591,544 | 5/1986 | Sasa et al. | 427/250 |
| 4,690,838 | 9/1987 | Hiraoka et al. | 427/343 |
| 4,983,252 | 1/1991 | Masui et al. | 427/96 |
| 4,996,074 | 2/1991 | Ogawa et al. | 427/12 |
| 5,079,600 | 1/1992 | Schnur et al. | 427/558 |
| 5,100,764 | 3/1992 | Paulson et al. | 427/126.3 |
| 5,123,998 | 6/1992 | Kishimura | 427/510 |
| 5,133,840 | 7/1992 | Buchwalter et al. | 427/306 |
| 5,158,860 | 10/1992 | Gulla et al. | 427/304 |
| 5,204,143 | 4/1993 | Nishimiya et al. | 427/387 |

FOREIGN PATENT DOCUMENTS

| | | |
|---|---|---|
| 0043480 | 1/1982 | European Pat. Off. . |
| 0147127 | 7/1991 | European Pat. Off. . |
| 2312499 | 12/1973 | Germany . |
| 2123442 | 2/1984 | United Kingdom . |

*Primary Examiner*—Shrive Beck
*Assistant Examiner*—Diana Dudash
*Attorney, Agent, or Firm*—John C. Fox

[57] ABSTRACT

Oxidic surfaces can be chemically modified according to a pattern by providing one or several monolayers of a photosensitive silane. After patterned exposure of said photosensitive silane, the exposed pans are esterified with an alcohol which comprises at least one fluorine atom, so that said exposed areas become strongly hydrophobic. Subsequently, the unexposed areas are exposed, so that these areas become hydrophilic. The hydrophilic areas can then be metallized in an electroless process, thereby forming a metal pattern.

14 Claims, 1 Drawing Sheet

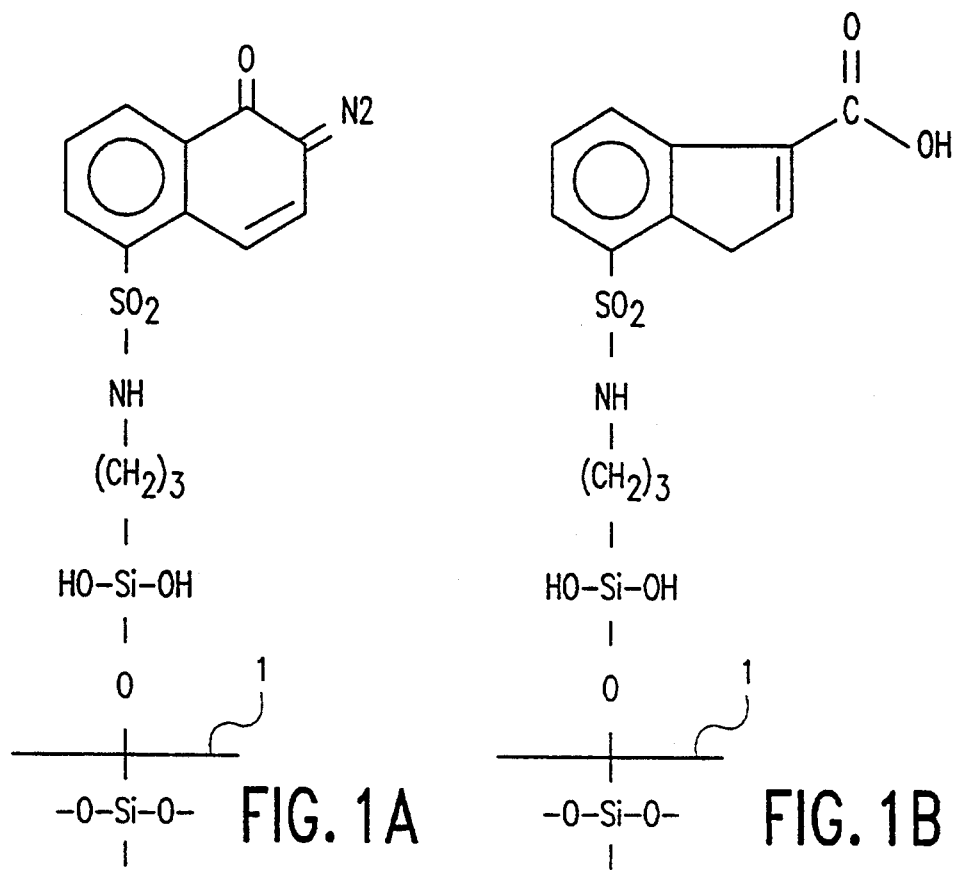
FIG. 1A
FIG. 1B
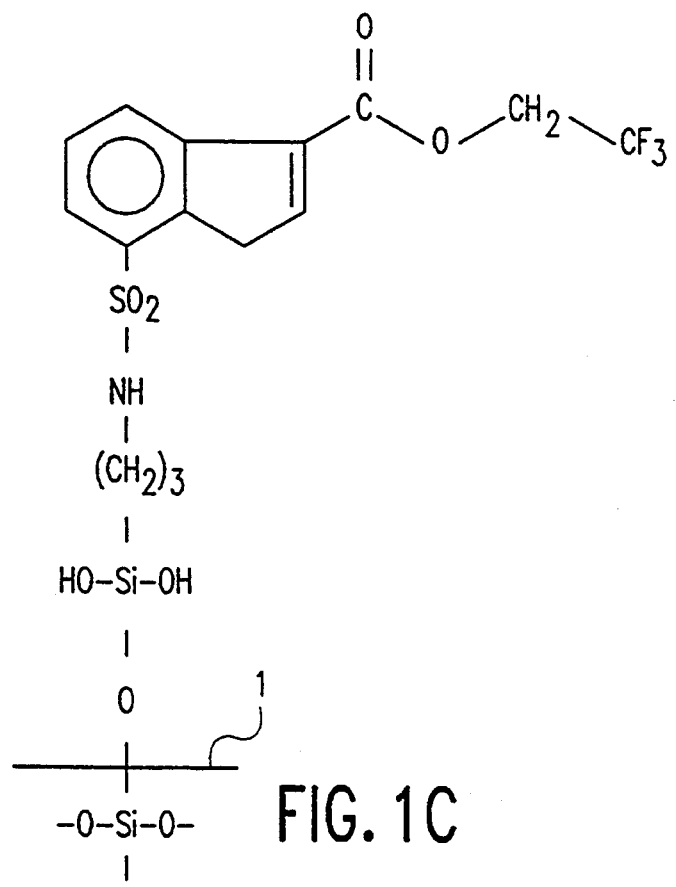
FIG. 1C

METHOD OF CHEMICALLY MODIFYING A SURFACE IN ACCORDANCE WITH A PATTERN

BACKGROUND OF THE INVENTION

The invention relates to a method of chemically modifying an oxidic substrate surface according to a pattern, in which method the substrate surface is brought into contact with a photosensitive alkoxy silane which comprises a quinone-diazide group, thereby forming a silane layer on the substrate surface, after which the silanated substrate surface is exposed to light in accordance with a pattern, causing the quinone-diazide groups to be convened into carboxylic acid groups in the exposed areas.

The invention also relates to a method of manufacturing a black matrix of metal on a glass face plate of a display device, such as a colour display tube and a liquid crystal display device (LCD).

Chemical surface modification makes it possible to change the properties of surfaces without altering the bulk properties of the substrate and the surface morphology. Said modification is obtained by applying a layer having a thickness of one or a few molecules to the substrate surface. For this purpose, the molecules of the layer comprise two functional groups, i.e. one group which reacts with the substrate surface and one group which determines the new property of the substrate surface. Preferably, the bond between these bifunctional molecules and the substrate is covalent. Organosilanes are often used as the bifunctional molecules. By applying a thin layer of silane (less than 10 nm) the adhesion between the substrate and polymers, such as certain adhesives, lacquers and photoresists, can be improved or corrosion of the substrate surface can be counteracted. Also release problems, which occur for example with moulds, can be controlled with a silane layer. Silane layers are also used to reduce leakage currents in semiconductor devices. Silane layers are further used as orientation layers for liquid crystals in liquid crystal display devices (LCDs).

Often only a part of the substrate surface has to be modified, whether or not in the form of a pattern. For this purpose, the silane layer can be locally removed from the substrate surface, for example, by local irradiation using deep UV light or another type of high-energy radiation, such as electron rays or X-rays or by means of reactive ion etching (RIE). This has the disadvantage that the customary lithographic imaging techniques are not suited for this purpose due to the long wavelength of the light used (in general longer than 300 nm). To overcome this problem, photosensitive silanes have been developed, i.e. silanes which are not only sensitive to electron rays and deep UV light (wavelength shorter than 300 nm), but also to light having wavelengths which are longer than 300 nm, such as light produced by a UV mercury vapour lamp (wavelength 360 nm). These photosensitive silanes are the reaction product of a quinone-diazide compound (also referred to as diazoquinone compound) comprising a reactive group, such as a sulphonyl chloride group ($SO_2Cl$) with an organosilane which also comprises a reactive group. The photosensitive silane is applied in the form of a layer to a substrate surface and, subsequently, exposed to patterned radiation with light having a wavelength of, for example, 360 nm. By exposing quinone-diazide groups, they are convened into carboxylic acid groups which exhibit a different reactivity with respect to, for example, solvents.

Such photosensitive silanes are known per se from European Patent Specification EP-B-147127. In accordance with said Patent Specification, for example, 2,1-diazonaphthoquinone-5-sulphonyl chloride is made to react with an organosilane comprising at least one reactive group, thereby forming a photosensitive silane. Said silane is applied to a substrate in a layer thickness ranging between 150 nm and 25 $\mu$m. After patterned exposure to UV light having a wavelength in the range between 200 and 450 nm, the exposed silane is removed with an alkaline solvent. The remaining silane pattern is used as an etch mask during plasma etching in an oxygen atmosphere.

It is known that exposure to UV light causes a diazonaphthoquinone group to be converted via a ketene group into an indenecarboxylic acid group under the influence of water. The indenecarboxylic acid group can cede protons and has other properties than the diazonaphthoquinone group in the unexposed areas. For example, it was found that, after wetting with aqueous solutions, both groups exhibited a different wetting behaviour. The wetting behaviour can be established by means of a contact angle measurement. In a contact angle measurement, a drop of a liquid is placed on the substrate surface to be measured and the contact angle $\theta$(°) between the substrate surface and the tangent to said liquid drop is determined in a point where the substrate surface, the liquid drop and air have a common boundary line. If water is used as the liquid, then $\theta$ is a measure for the wettability of the substrate surface with water. If $\theta = 0°$, then the substrate surface is completely wettable and is termed hydrophilic. If $\theta > 0°$, then the substrate surface is less readily wettable and the hydrophobic character of the substrate surface increases. The greater the value of $\theta$, the greater the water-repelling capacity of the substrate surface. It was found that the above-mentioned exposed areas having indenecarboxylic acid groups can be wetted completely ($\theta = 0°$ C.) with alkaline solutions having a pH $>$ 10, while solutions having a pH-value of 4–6 yield a $\theta$-value of 40°. The unexposed areas having diazonaphthoquinone groups are hydrophobic, and $\theta = 60°$–65°.

A disadvantage of the known method is that, for certain applications, the difference in water-repelling capacity between exposed and unexposed areas is insufficient. A further disadvantage is that as a result of the use of relatively thick silane layers (150 nm to 25 $\mu$m) the known method is relatively unsuitable for providing very fine patterns (lateral resolution $<$ 1 $\mu$m), because interference and absorption phenomena occur when these relatively thick silane layers are exposed to light.

OBJECTS AND SUMMARY OF THE INVENTION

It is an object of the invention to provide, inter alia, an improved method of pattern-wise chemically modifying an oxidic substrate surface, in which method the difference in water-repelling capacity between exposed and unexposed areas is increased and which can suitably be used for the manufacture of patterns having a lateral resolution of less than 1 $\mu$m. A further object of the invention is to provide a simple method of metallizing an oxidic substrate surface in accordance with a pattern, in particular, providing a black matrix of metal on a glass face plate of a flat display device, such as a liquid crystal display device (LCD and LC-TV).

This object is achieved by a method as described in the opening paragraph, which is characterized according to the invention in that after patterned exposure to light, the silane layer is brought into contact with an alcohol comprising at least one fluorine atom, thereby converting the carboxylic acid groups into hydrophobic ester groups in the exposed areas, after which the quinone-diazide groups in the unexposed areas are exposed to light, thereby forming carboxylic acid groups. Substrate surfaces of oxidic materials, such as glass, quartz, quartz glass, $SiO_x$ and $Al_2O_3$ comprise hydroxyl groups by nature. Said hydroxyl groups form a covalent bond with the alkoxy groups (such as methoxy or ethoxy groups) of the silane, while splitting off the corresponding alcohol (methanol or ethanol, respectively). The alkoxysilane can also previously be hydrolysed into a silanol, after which the silanol groups react with the hydroxyl groups of the substrate surface, while splitting off water. The previously effected conversion into a silanol generally results in improved adhesion between the substrate and the silane. In the case of glass or quartz glass surfaces a covalent Si—O—Si bond between the silane and the surface is formed. When $Al_2O_3$ is used as the substrate, an Al—O—Si bond is formed. The photosensitive silane is provided on the substrate surface by spin coating an aqueous and/or alcoholic solution or by immersing the substrate in an aqueous and/or alcoholic solution. The concentration of the photosensitive silane in this solution is not critical and ranges between, for example, 0.1 and 3 wt. %. When the photosensitive silane layer is exposed to UV light, quinone-diazide groups of the photosensitive silane are converted into carboxylic acid groups. Examples of quinone-diazide groups are the 1,2-diazobenzoquinone group and the 2,1-diazonaphthoquinone group. Other quinone-diazides are mentioned listed in said European Patent EP-B-147127. In accordance with the invention, following said exposure, the carboxylic acid groups are esterified by reacting them with an alcohol comprising at least one fluorine atom, such as 2,2,2-trifluoroethanol. An alcohol which is very suitable is 1,1,1,3,3,3-hexafluoroisopropanol. Esterification preferably takes place in the vapour phase in the presence of pyridine as the catalyst and di-tert-butylcarbodiimide or di-tert-propylcarbodiimide as the reactant for the water formed. The carboxylic groups which are esterified with fluorine groups exhibit strongly water-repellent (hydrophobic) properties, the contact angle $\theta$ assuming values up to approximately 90°. In addition, the contact angle is independent of the pH-value of the aqueous solution. After said esterification, the unexposed pans of the silane layer comprising quinone-diazide groups are exposed in a second exposure step, thereby forming (hydrophilic)carboxylic acid groups. In this manner, a pattern consisting of hydrophilic and strongly hydrophobic pans is formed.

The layer thickness of the silane layer provided is maximally 10 nm. Preferably, a silane layer having a thickness in the range from 1 to 4 monolayers (thickness 2-3 nm) is used. By using such very thin layers it is achieved that no noticeable interference and absorption phenomena occur during exposure to light, so that the lateral resolution of the pattern provided is less than 1 $\mu m$. By virtue of the very thin layer thickness a relatively short exposure time and a relatively low light intensity can be used. The exposure step can be carried out with light sources which are customarily used in photolithography and which emit light in the near UV (330–440 nm), such as a UV mercury vapour lamp emitting light with a wavelength of 360 nm. Shorter wavelengths can also be used, for example, light having a wavelength of 254 nm originating from a low-pressure mercury discharge lamp. In principle, such photosensitive silanes are sensitive to light in the range between approximately 200 and 450 nm.

Said photosensitive silanes can be prepared by reacting a quinone-diazide comprising a reactive group, such as a sulphonyl halogenide, with an alkoxysilane comprising a reactive group, such as an amino group. Suitable quinone-diazides comprising a reactive group are mentioned in said European Patent EP-B-147127. An example of such a compound is 2,1-diazonaphthoquinone-5-sulphonyl chloride. The alkoxysilane may be a mono, di or trialkoxysilane. A suitable trialkoxysilane is, for example, 3-aminopropyl triethoxysilane (known as A-1100). Also amino methoxysilanes can be used, such as N-(2-aminoethyl)-3-aminopropyl trimethoxysilane (known as A-1120). The preparation of such a photosensitive silane is described in German Patent Application DE-A-2312499. The compound represented by formula (V) in said Patent Application is added in a concentration of 1 wt. % to a customary photoresist composition to improve the adhesion of the photoresist layer, resulting in a reduced degree of underetching of the photoresist layer when aqueous etching solutions are used. Owing to the thickness of several tens of $\mu m$ of the photoresist layer used, a lateral resolution of less than 1 $\mu m$ is not possible.

The pattern of hydrophobic and hydrophilic areas obtained by means of the inventive method can be used to control the adhesion of all kinds of materials to an oxidic substrate surface. Other applications lie in the field of patterned powder deposition and in the field of high-resolution ink printing.

An important application of the method in accordance with the invention is the pattern-wise metallization of oxidic substrate surfaces, such as glass. By treating the substrate comprising pattern-wise provided hydrophobic and hydrophilic areas with an aqueous solution of a Pd salt, the hydrophilic areas (which contain carboxylic acid groups) form complexes with Pd ions. Due to the acid character of the carboxylic acid groups, preferably, an alkaline Pd salt is used, such as $Pd(NH_3)_2(OAc)_2$. The areas which are esterified with an alcohol comprising at least one fluorine atom are strongly water repellent and form no complex with Pd ions. The unbound Pd ions can be rinsed off with water. The complexes formed with Pd-ions are the nuclei for subsequent electroless metallization. In an electroless metallization bath the areas having complexed Pd ions are metallized, whereas the water-repelling areas remain unmetallized. By virtue of the high resolution of the hydrophobic/hydrophilic pattern formed a metal pattern having a high resolution is obtained in a simple manner. Suitable electroless metallization baths are, for example, electroless nickel and copper baths. The most important constituents of such baths are nickel salt and copper salt, respectively, and a reducing agent, such as sodium hypophosphite and formaldehyde, in water.

Examples of applications include the provision of metal patterns in flat colour display tubes, conductive patterns for chip-on-glass, copper patterns as coils for mini-motors and IC-metallization.

The method in accordance with the invention can very suitably be used for providing metal electrodes around and in the holes of glass selection plates of an electron fibre display as described in European Patent Application EP-A-400750.

The method in accordance with the invention can very suitably be used for the manufacture of a black matrix of metal on a glass face plate of a display device, for example a liquid crystal display device (LCD and LC-TV). In a LC-TV one of the glass substrates forms the passive plate. Said passive plate comprises patterned colour filters in the colours blue, green and red.

In order to improve the contrast between the colour filters, a light-absorbing grating, the m-called "black matrix", is arranged between said colour filters. For this purpose, frequent use is made of a thin chromium film in which apertures are photolithographically provided, i.e. providing the photoresist, exposing, developing, etching and stripping off the resist. Said apertures form the pixels of the passive plate and have dimensions, in a typical example, of $50 \times 70$ $\mu$m. A disadvantage of the known method is the large number of process steps required. The method in accordance with the invention makes it possible to manufacture a black matrix of nickel for a passive plate for an LCD in a simple manner. The method in accordance with the invention comprises the following successive process steps:

providing the photosensitive silane layer on a glass plate;

arranging a mask having apertures of $50 \times 70$ $\mu$m on the silane layer;

exposing the photosensitive silane layer through the mask by using a UV mercury vapour lamp;

esterifying the exposed areas with an alcohol comprising at least one fluorine atom;

total exposure of the silane layer with an UV mercury vapour lamp;

immersing the glass plate in an aqueous solution of Pd ions;

immersing the glass plate in an electroless nickel bath, thereby forming the black matrix.

At a thickness of 0.1 $\mu$m, the nickel layer is optically tight.

The method in accordance with the invention can also be used for the manufacture of a black matrix of metal on face plates of flat colour display tubes, such as flat cathode ray tubes and electron-fibre displays, in which display tubes the black matrix forms a light-absorbing grating between the phosphor dots.

It is noted that in European Patent Specification EP-B-43480 a description is given of a method of manufacturing a metal pattern on a substrate, in which method a mixture of a polymetal compound —M—M—(—M—)$_n$—M—, where M is a Si, Ge or Sn atom, a photosensitive substance and an organic solvent are prepared and this mixture is provided on the substrate in the form of a layer. After patterned irradiation with UV light of a wavelength of 365 nm and an intensity of 14.3 mW/cm$^2$ for ten minutes, the substrate is immersed in an AgClO$_4$ solution. Ag particles are formed in the unexposed parts which are subsequently copper-plated in an electroless copper bath. The mechanism is based on breaking the chemical bond between the metal atoms of the polymetal compound by exposure to light. The unexposed polymetal compound can reduce metal ions, such as Ag*, to metallic Ag. In this known method no photosensitive silane compounds are used which are provided on a substrate in one or more than one monolayers, so that in said known method relatively long exposure times and relatively high exposure intensities are required. In the known method, no pattern of hydrophobic and hydrophilic areas is formed.

From British Patent Application GB-A-2123442, it is known to provide an aminosilane on an oxidic surface, which layer is locally destroyed by means of actinic radiation. The non-irradiated areas are metallized in an electroless process. No photosensitive silanes are used, so that the silane can only be destroyed with an electron ray or with deep UV-light (wavelength < 300 nm).

From U.S. Pat. No. 4,996,075, a method of patternwise depositing a very thin silver film on a SiO$_2$ surface is known. In said method the surface is treated with a solution of a silane with a vinyl or acetylene group in an organic solvent, such as carbon tetrachloride and chloroform. In this treatment a monomolecular layer of said silane is formed on the SiO$_2$ surface, i.e. a silane layer having a thickness equal to the length of the silane molecule. By locally irradiating the silane layer with an electron beam, the vinyl or acetylene groups are mutually chemically bonded, thereby forming a polymer layer, and hence selectively deactivated. Subsequently, the surface is successively immersed in a solution of diborane in THF and in an alkaline solution of hydrogen peroxide, so that the non-irradiated vinyl groups are converted into hydroxyl groups. Next, the hydroxyl groups are converted into aldehyde groups. By treating the silver ions with an aqueous silver nitrate solution, said silver ions are reduced by the aldehyde groups to metallic silver, thereby forming a patterned silver layer having a thickness of one atom layer in the non-irradiated areas. By spontaneous conversion of the monoatomic silver layer into a monomolecular silver oxide layer, a second monomolecular layer of vinyl silane can be formed on the silver oxide layer, after which the above steps of converting vinyl groups via hydroxyl groups into aldehyde groups are repeated. Subsequently, a second treatment with an aqueous silver nitrate solution is carried out which results in the formation of a second monomolecular silver oxide layer. By repeating these steps many times, an alternating laminate of monolayers of silane and monolayers of silver oxide is obtained. In this known method no photosensitive silanes are used, so that exposure to UV light having a wavelength of, for example, 360 nm is useless. A disadvantage of this known method is formed by the large number of process steps required to obtain a metal pattern having a layer thickness which is sufficient, for example 0.1 $\mu$m or more, to obtain a layer which is optically tight and/or which has a sufficiently low electrical resistance. Another disadvantage is the use of harmful organic solvents, such as chlorinated hydrocarbons, as the solvent for the silanes comprising a vinyl or acetylene group.

BRIEF DESCRIPTION OF THE DRAWINGS

The invention will be explained in greater detail by means of exemplary embodiments and with reference to the accompanying drawings, in which FIG. 1A diagrammatically shows a silicon oxide surface having a covalently bonded photosensitive silane;

FIG. 1B shows the same part as FIG. 1A after exposure to UV light, and

FIG. 1C shows the same part as FIG. 1B after esterification with 2,2,2-trifluoroethanol.

DESCRIPTION OF THE PREFERRED EMBODIMENT

Exemplary Embodiment 1 (Not According To The Invention)

1-(2,1-diazonaphthoquinone-5-sulphonyl amido)-3-(triethoxysilyl)-propane is a photosensitive silane which is prepared by reacting 3-aminopropyl triethoxysilane (A-1100) with 2,1-diazonaphthoquinone-5-sulphonyl chloride in a molar ratio of 2:1 in toluene at room temperature. The photosensitive silane is precipitated from the reaction product and is filtered off. A quantity of 10 grams of the solid obtained is dissolved in isopropanol to which 5% by volume of water and 5 drops of acetic acid are added. As a result, the triethoxysilane group of the photosensitive silane is hydrolysed into a silane triol group.

A glass plate which is cleaned in a customary manner is used as the substrate. The solution containing the photosensitive silane is provided on the glass plate by spin coating. The photosensitive silane forms a covalent bond with the —SiOH groups of the glass surface. The thickness of the photosensitive silane layer obtained is 2–3 nm (corresponding to 3–4 monolayers of silane). FIG. 1A diagrammatically shows a glass surface 1 having a covalently bonded molecule of the photosensitive silane.

The silanated substrate is partly exposed to light from a UV-mercury vapour lamp having a wavelength of 360 nm. In the exposed areas, the photosensitive silane is completely converted within 10 seconds at a light intensity of 1.7 mW/cm$^2$. Due to said exposure the diazonaphthoquinone group is converted into an indenecarboxylic acid group (FIG. 1B). Said indenecarboxylic acid group can cede protons and its reactivity differs from that of the unexposed areas. The wetting of the exposed parts depends upon the pH-value of the aqueous solutions used. Complete wetting (contact angle $\theta=0°$) with alkaline solutions occurs if the pH-value is above 10, while solutions having pH-values of 4–6 render a maximum $\theta$-value of 40°. The $\theta$-value in the unexposed areas (with diazonaphthoquinone groups) is 60°–65°. In most cases, this difference in wetting is insufficient.

Exemplary Embodiment 2 (According To The Invention)

Exemplary embodiment 1 is repeated and after pattern-wise exposure at 360 nm, the exposed areas are esterified with 2,2,2-trifluoroethanol. Said esterification is carried out in the vapour phase by locating the glass plate above a liquid mixture for 12 hours, which liquid mixture consists of 0.9 ml of 2,2,2-trifluoroethanol, 0,4 ml of pyridine and 0,3 ml of di-tert-butylcarbodiimide. As a result, the indenecarboxylic acid groups in the exposed areas are esterified (FIG. 1C). The esterified areas are strongly water repellent ($\theta=75°$) and wetting is independent of the pH-value of the aqueous solution. The unexposed areas having diazonaphthoquinone groups can be rendered hydrophilic by exposing them to UV light in a second exposure step in which they are converted into indenecarboxylic acid groups. In accordance with this method, hydrophilic and hydrophobic areas can be formed on the glass substrate by means of patterned irradiation.

Exemplary Embodiment 3 (In Accordance With The Invention)

Exemplary embodiment 2 is repeated; 1,1,1,3,3,3-hexafluoroisopropanol being used for the esterification. The esterified areas are rendered even more water repellent ($\theta=90°$).

Exemplary Embodiment 4 (In Accordance With The Invention)

The glass plate obtained in accordance with exemplary embodiment 2, having pattern-wise provided hydrophobic and hydrophilic areas, is immersed in a 1 wt. % solution of Pd(NH$_3$)$_2$(OAc)$_2$ in water for 1 minute. The hydrophilic areas of the glass surface (having indenecarboxylic acid groups) form a complex with Pd ions. The strongly water-repellent esterified portions cannot form a complex with Pd ions. The complexed Pd ions serve as nuclei in the electroless metallization process. Unbound ions are removed by rinsing with water. Subsequently, the glass plate is immersed in an electroless nickel bath comprising 33.17 grams of NiSO$_4$.6H$_2$O, 13.45 ml of H$_3$PO$_2$ (50 wt. %), 60.02 grams of citric acid and 61,76 grams of (NH$_4$)$_2$SO$_4$ per litre of water. By means of ammonium hydroxide the nickel bath is brought to a pH-value of 8 and has a temperature of 90° C. In the areas nucleated with Pd ions, nickel is deposited in a layer thickness of 0.1 μm in 8 minutes. In the esterified hydrophobic areas, i.e. the areas exposed to light during patterned exposure, no nickel is deposited. If desired, electroless nickel-plating can be preceded by a reduction of the Pd ions to metallic Pd using a solution of 1 wt. % of NaBH$_4$ in water. Since a reducing agent (H$_3$PO$_2$) is present in the electroless nickel bath, this separate reduction step is not necessary per se, however, separate reduction accelerates the nickel-plating process.

In accordance with this method, pattern-wise metallization of oxidic surfaces can be carried out in a simple manner. By virtue of the very small thickness (one or several monolayers) of the silane layer used, a high lateral resolution of 1 μm or less is attained. The use of photosensitive silanes enables near-UV light having a wavelength of 360 nm to be applied, so that customary lithographic imaging techniques can be used.

Exemplary Embodiment 5 (In Accordance With The Invention)

A borosilicate glass plate having dimensions of 9×12 cm and a thickness of 1 mm is provided with a monolayer of a photosensitive silane as described in exemplary embodiment 1. The silane layer is covered with a mask of invar (NiFe) in which apertures of 50×70 μm are etched. The pitch of the apertures is 5 μm. After exposure of the silane layer to UV light through the mask, esterification of the exposed areas using 1,1,1,3,3,3-hexafluoroisopropanol, second exposure, nucleation with Pd ions and electroless nickel plating, as described in the preceding exemplary embodiments, a glass plate having a rectangular nickel pattern of lines having a width of 5 μm and a thickness of 0.1 μm is obtained. This nickel pattern forms the black matrix on a glass supporting plate for an LCD. In a customary manner, colour filters are then provided in the apertures of the nickel pattern. Subsequently, an equalizing layer and an indium-tin oxide layer (ITO) are successively provided, thereby completing the so-called passive plate of the LCD.

The method in accordance with the invention makes it possible to manufacture a black matrix of metal for LCDs and LC-TV in a simple manner. Also a black matrix for the phosphor dots in flat colour display tubes, such as flat cathode rab 53789160.001 y tubes and electron-fibre displays can be manufactured by means of the method in accordance with the invention. The inventive method also enables metal electrodes to be provided on the selection plates of electron-fibre displays.

We claim:

1. A method of chemically modifying an oxidic substrate surface according to a desired pattern, in which method the substrate surface is brought into contact with a photosensitive alkoxysilane which comprises quinone-diazide groups, thereby forming a silane layer on the substrate surface, after which the substrate surface provided with the silane layer is exposed to light in accordance to said pattern thereby causing said quinone-diazide groups be converted into carboxylic acid groups in exposed areas of said pattern, characterized in that after said exposure to light said silane layer is brought into contact with an alcohol comprising at least one fluorine atom, thereby converting said carboxylic acid groups in said exposed areas into hydrophobic acid groups, after which quinone-diazide groups present in unexposed areas of said pattern are exposed to light, thereby forming carboxylic acid groups.

2. A method as claimed in claim 1, characterized in that 2,2,2-trifluoroethanol is used as the alcohol comprising at least one fluorine atom.

3. A method as claimed in claim 1, characterized in that 1,1,1,3,3,3-hexafluoroisopropanol is used as the alcohol comprising at least one fluorine atom.

4. A method as claimed in claim 1, characterized in that a silane layer having a maximum thickness of 10 nm is provided.

5. A method as claimed in claim 1, characterized in that exposure is carried out using UV light having a wavelength of 360 nm.

6. A method as claimed in claim 1, characterized in that a silane is used which is the reaction product of 3-aminopropyl triethoxysilane and 2,1-diazonaphthoquinone-5-sulphonyl chloride.

7. A method as claimed in claim 1, characterized in that after the conversion of the quinone-diazide groups into a pattern of areas comprising hydrophobic ester groups and areas comprising carboxylic acid groups, the modified substrate surface is treated with an aqueous solution of Pd ions, after which the modified substrate surface is brought into contact with an electroless metallization bath, thereby forming a metal pattern in the areas comprising carboxylic acid groups.

8. A method as claimed in claim 7, characterised in that an electroless nickel bath is used as the metallization bath.

9. A method of providing a black matrix of metal on a passive glass face plate of a liquid crystal display device characterized in that said black matrix is formed according to a method of claim 7, wherein the electroless metallization bath is an electroless nickel metallization bath.

10. A method as claimed in claim 2, characterized in that after the conversion of the quinone-diazide groups into a pattern of areas comprising hydrophobic ester groups and areas comprising carboxylic acid groups, the modified substrate surface is treated with an aqueous solution of Pd ions, after which the modified substrate surface is brought into a contact with an electroless metallization bath, thereby forming a metal pattern in the areas comprising carboxylic acid groups.

11. A method as claimed in claim 3, characterized in that after the conversion of the quinone-diazide groups into a pattern of areas comprising hydrophobic ester groups and areas comprising carboxylic acid groups, the modified substrate surface is treated with an aqueous solution of Pd ions, after which the modified substrate surface is brought into a contact with an electroless metallization bath, thereby forming a metal pattern in the areas comprising carboxylic acid groups.

12. A method as claimed in claim 4, characterized in that after the conversion of the quinone-diazide groups into a pattern of areas comprising hydrophobic ester groups and areas comprising carboxylic acid groups, the modified substrate surface is treated with an aqueous solution of Pd ions, after which the modified substrate surface is brought into a contact with an electroless metallization bath, thereby forming a metal pattern in the areas comprising carboxylic acid groups.

13. A method as claimed in claim 5, characterized in that after the conversion of the quinone-diazide groups into a pattern of areas comprising hydrophobic ester groups and areas comprising carboxylic acid groups, the modified substrate surface is treated with an aqueous solution of Pd ions, after which the modified substrate surface is brought into a contact with an electroless metallization bath, thereby forming a metal pattern in the areas comprising carboxylic acid groups.

14. A method as claimed in claim 6, characterized in that after the conversion of the quinone-diazide groups into a pattern of areas comprising hydrophobic ester groups and areas comprising carboxylic acid groups, the modified substrate surface is treated with an aqueous solution of Pd ions, after which the modified substrate surface is brought into a contact with an electroless metallization bath, thereby forming a metal pattern in the areas comprising carboxylic acid groups.

* * * * *